(12) United States Patent
Naiki

(10) Patent No.: US 6,960,830 B2
(45) Date of Patent: Nov. 1, 2005

(54) SEMICONDUCTOR INTEGRATED CIRCUIT DEVICE WITH DUMMY BUMPS

(75) Inventor: Takashi Naiki, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 10/697,504

(22) Filed: Oct. 30, 2003

(65) Prior Publication Data
US 2004/0130023 A1 Jul. 8, 2004

(30) Foreign Application Priority Data
Oct. 31, 2002 (JP) ........................................ 2002-318354

(51) Int. Cl.$^7$ .......................... H01L 25/04; H01L 25/18; H01L 23/48

(52) U.S. Cl. ........................ 257/738; 257/737; 257/778; 257/784; 257/780; 257/734; 257/772; 257/775; 257/781

(58) Field of Search ................................ 257/738, 737, 257/734, 784, 775, 781, 772, 780

(56) References Cited

U.S. PATENT DOCUMENTS

| | | | | |
|---|---|---|---|---|
| 5,814,891 | A | * | 9/1998 | Hirano ........................ 257/778 |
| 6,287,895 | B1 | * | 9/2001 | Sato ............................ 438/114 |
| 6,677,677 | B2 | * | 1/2004 | Kimura et al. ............... 257/737 |
| 6,756,686 | B2 | * | 6/2004 | Iwasaki et al. ............. 257/778 |
| 2001/0051396 | A1 | * | 12/2001 | Iwahashi et al. ............ 438/120 |
| 2002/0167623 | A1 | * | 11/2002 | Aruga et al. ................... 349/56 |
| 2002/0190336 | A1 | * | 12/2002 | Shimizu et al. ............. 257/459 |
| 2003/0060035 | A1 | * | 3/2003 | Kimura et al. .............. 438/626 |
| 2003/0092326 | A1 | * | 5/2003 | Nishikawa et al. .......... 439/894 |
| 2004/0017008 | A1 | * | 1/2004 | Ueda .......................... 257/734 |

FOREIGN PATENT DOCUMENTS

| | | | | |
|---|---|---|---|---|
| JP | 6-29296 | * | 2/1924 | .................. 257/737 |
| JP | 1-238148 | * | 9/1989 | .................. 257/780 |
| JP | 4-94732 | | 8/1992 | |
| JP | 7-263488 | | 10/1995 | |
| JP | 8-46313 | | 2/1996 | |
| JP | 9-115910 | * | 5/1997 | |
| JP | 9-246426 | * | 9/1997 | |
| JP | 10-154726 | * | 6/1998 | |
| JP | 2001-35872 | * | 2/2001 | |
| JP | 2003-17530 | * | 1/2003 | |
| JP | 2003-100949 | * | 4/2003 | |
| JP | 2003-234435 | * | 8/2003 | |
| JP | 2003-282812 | * | 10/2003 | |

* cited by examiner

Primary Examiner—Alexander Oscar Williams
(74) Attorney, Agent, or Firm—Hamre, Schumann Mueller & Larson, P.C.

(57) ABSTRACT

A semiconductor integrated circuit device which requires high packaging density adopts a method for forming bumps in a terminal section of a semiconductor chip and bonding the semiconductor chip directly on a substrate. In this case, in order to prevent damage to the semiconductor integrated chip, which would otherwise be caused by bonding pressure employed at the time of bonding operation, non-connected dummy bumps are provided at corner sections of the semiconductor chip. Even when the dummy bumps are provided, there arises a necessity for preventing an increase in the size of the semiconductor chips, which would otherwise arise when the dummy bumps are provided on the chip.

2 Claims, 6 Drawing Sheets

LENGTH OF CHIP EDGE

SEMICONDUCTOR INTEGRATED CIRCUIT DEVICE WITH DUMMY BUMPS

BACKGROUND OF THE INVENTION

1. Field of the Invention

The present invention relates to a semiconductor integrated circuit device having high packaging reliability.

Particularly, the invention relates to a semiconductor integrated circuit device provided with the facedown bonding bumps having an electrical connection capability that are provided at a terminal section on the surface of a semiconductor substrate and which has electrically-non-connected dummy bumps.

2. Description of the Related Art

Performance enhancement of electronic devices has recently been pursued, and a semiconductor integrated circuit packaged in the devices is required to have high performance and complicated features. Means for enabling high-density packaging is demanded particularly for a semiconductor integrated circuit device to be provided in small equipment, such as a portable data terminal or portable cellular phone and so on.

For theses reasons, a semiconductor integrated circuit device has been conventionally packaged as a chip without performing plastic sealing. Therefore, a method has been adopted for providing projections, such as known for bumps, on the terminals of a chip and mounting the chip to a substrate by a flip chip bonding method. Specifically, when a semiconductor integrated circuit device is packaged, facedown bonding is adopted for placing a chip opposite an object of connection, such as a substrate, and pressing the chip directly on the substrate using anisotropic conductive particles (ACP) or a conductive material.

In this case, since the back side of the chip is ground due to a need for slimming down a chip, the chip comes to be warped or susceptible to variations in its thickness, and furthermore the horizontal positions of the bumps formed on the surface of the chip are also displaced (see FIG. 7(a))

In such an occasion, one of the four corners of the chip often comes into contact with the substrate at first prior to the rests of the corners doing in the facedown mounting because of fluctuations in the height of bumps or the insufficient precision of a bonding machine used for bonding a chip on the mounting substrate (see FIG. 7(b)).

Consequently, when the chip is mounted, bumps located around the four corners of the chip are subjected to heavier load stress than that imposed on bumps disposed around the center of the peripheral edges of the chip. For the purpose of protecting the bumps or an electrical circuit on the chip by eliminating an unbalance in load stress, electrically-non-contact dummy bumps have been conventionally provided such as described in JP-A-8-46313 or JP-UM-T-4-94732.

It is also disadvantageous to adopt the dummy bumps that are disclosed in JP-A-8-46313 from the reason such that the dummy bumps are arranged to be abutted to the edges of the chip, whereby unfavorable particles might be produced in case of dicing the wafer into the chips.

Furthermore, JP-A-7-263488 discloses the dummy bumps. However, the dummy bumps are not used for the purpose of the facedown bonding, and besides, there is no idea of solving the problems such as the chip being warped or susceptible to variations in its thickness or subjected to the heavier load stress.

In recent years, because of an improvement in performance of an LSI; particularly, due to colorization of an LCD driver or a tendency of the larger size of a screen, the numbers of the terminals to be used are increased, and a highly-integrated semiconductor process is required. In such an occasion, downsize of a chip area cannot be achieved unless intervals between bumps are made narrower than they have been made before. In recognition of this requirement, the area of each bump also comes to be smaller, which ended up increasing the number of dummy bumps to be disposed at each of the corners of one chip.

The related-art semiconductor integrated circuit device is limited in narrowing the interval between the bumps, because of a particle size (3 $\mu$m to 5 $\mu$m) of the anisotropic conductive particles (ACP), which shall ensure at least a distance from 10 $\mu$m to 15 $\mu$m between the bumps.

In contrast, the areas of the individual bumps are required to be substantially the same in size with each other from a need of electrically connecting the chip with the substrate in use of the ACP. As a result, as shown in FIG. 8, each of the respective bumps in case of narrowing the interval between the bumps might become a narrow shape. For these reasons, as the numbers of the dummy bumps increase the so-called invalid area (hatched in FIG. 8), a space residing between the bumps, becomes larger in the ratio of the bump area. Accordingly, an increase in the number of dummy bumps merely results in increase of the area where the dummy bumps are disposed in relation to the total area of the bumps, which becomes a limitation on downsizing of a chip.

Reflecting these requirements, in the related art, the following has been adopted. FIG. 1 is a view showing the entirety of a chip of a semiconductor integrated circuit device to be used for facedown bonding of the related art. The semiconductor integrated circuit device chip 1 has facedown bonding bumps 6 arranged so as to surround unillustrated internal circuit. In the embodiment, bumps are arranged along four sides of a chip 1 of the semiconductor integrated circuit device surrounding the internal circuit. In an alternative configuration, no bumps 6 are provided along one or two specific edges, and a circuit or wiring is provided instead of the bumps.

FIGS. 2 is an enlarged view showing a chip corner section 5 enclosed by broken edges in FIG. 1 as a representative of four corners of the semiconductor integrated circuit device chip 1. The drawings will be described herein below.

FIG. 2 is a view showing the layout of related-art bumps. There are provided circuit connection bumps 3 connected to an unillustrated internal circuit, and two dummy bumps 2 which are placed for each edge, between the corner section of the chip 1 of the semiconductor integrated circuit device and the bumps 3. There can be obtained a load capacity effect of an area corresponding to the area occupied by a total of four circuit connection bumps 3. An inside of the area enclosed by broken line corresponds to the area on the chip 1 of the semiconductor integrated circuit device ensured for dummy bumps.

However, this related art is still not sufficient for overcoming the above-mentioned problems from the aspects of the recent improvement functionalities of LSI technologies or highly advanced semiconductor integration processes.

SUMMARY OF THE INVENTION

It is an object of this invention to provide the semiconductor integrated circuit device whose areas for disposing the facedown bonding bumps on the semiconductor chip can be used effectively. In order to provide such a semiconductor integrated circuit device, it is the first aspect of this invention to provide a semiconductor integrated circuit device having bumps provided in a terminal section on a surface of a semiconductor substrate, said bumps having electrical connection capabilities, as well as electrically-non-contact dummy bumps, wherein said electrically-non-contact dummy bumps are disposed in the vicinity of one or more corner sections of four corners of a semiconductor chip, and further wherein the area of the dummy bumps projected onto a chip is larger than the area of the bumps.

According to the above aspect of this invention, the facedown bonding dummy bumps located in the vicinity of the corner sections of the semiconductor chip are larger than the bumps with electrical capabilities that are located around them.

Having said bump arrangement, an area located between the dummy bumps, which is regarded as an open space, can also be used as an area for dummy bumps. As a result, the area on the semiconductor chip to be used for placing dummy bumps becomes smaller than that of required in the related art. Hence, the area of the semiconductor chip can be made small.

The semiconductor integrated circuit device according to the second aspect of this invention is characterized by the semiconductor integrated circuit device of the first aspect, and further comprising a wiring which is disposed below the dummy bumps with at least one insulating film in-between and not electrically connected to the dummy bumps.

According to this aspect, a wiring which is not electrically connected to the dummy bumps can be placed below dummy bumps located around the corner sections of the semiconductor chip. As the result, the area on the semiconductor chip that has been used solely only for dummy bumps can also be effectively used for wiring. Consequently, the area of the semiconductor chip can be made much smaller.

DESCRIPTION OF THE PREFERRED EMBODIMENTS

An embodiment of a semiconductor integrated circuit device of the invention will be described below by reference to FIGS. 3 through 6(b), FIGS. 3, 4, and 5 are enlarged views showing the chip corner sections 5 of the semiconductor chip, each as a representative of four corners of the semiconductor integrated circuit device. The drawings will be described hereinbelow.

Figure 1:
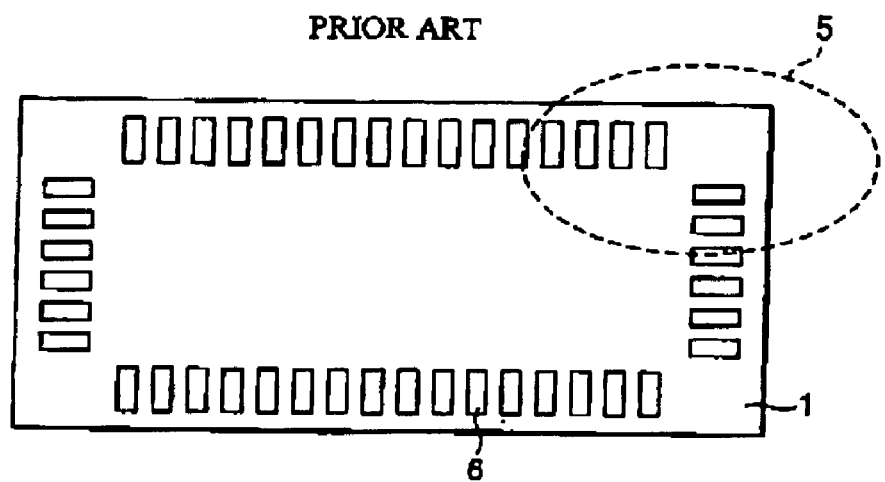
FIG. 1 is a chip view of a semiconductor integrated circuit device having facedown bonding bumps provided thereon.
Figure 2:
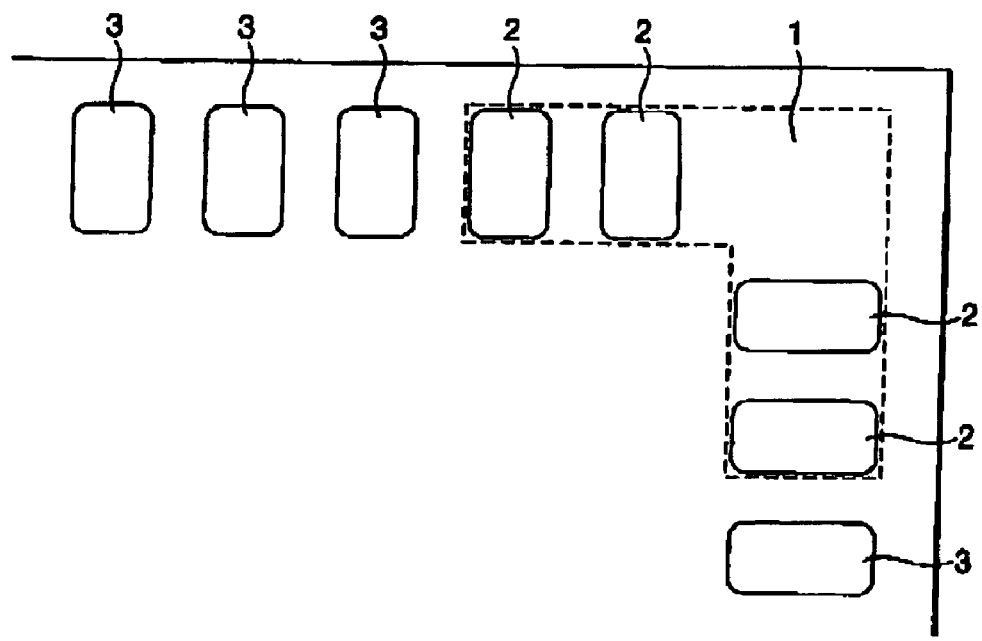
FIG. 2 is a chip view of a semiconductor integrated circuit device having related-art facedown bonding bumps provided thereon.
Figure 3:
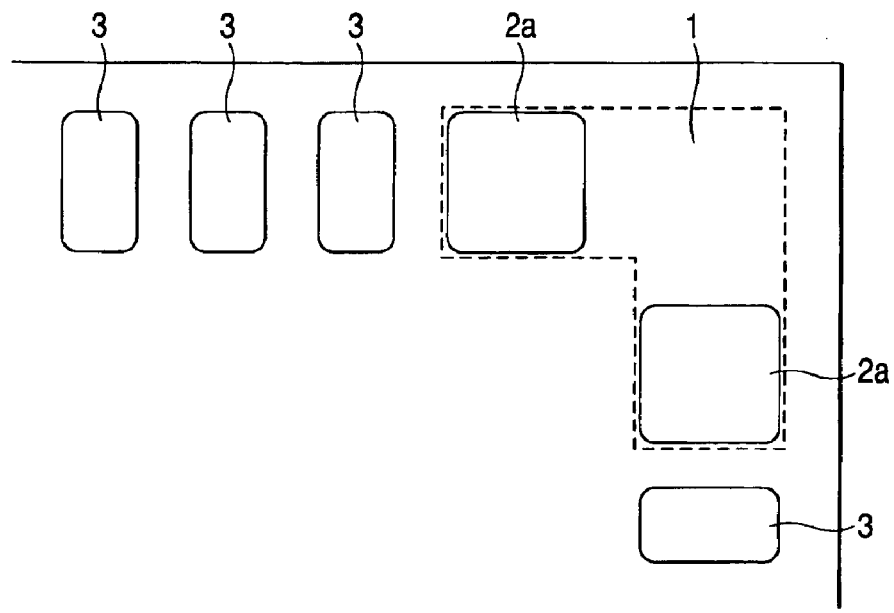
FIG. 3 is a chip view of a semiconductor integrated circuit device having facedown bonding bumps of a first embodiment of the invention provided thereon.

FIG. 3 is a bump layout view showing the first embodiment. There are provided the circuit connection bumps 3 connected to the unillustrated internal circuit, and one dummy bump 2a which is placed for each edge, between the corner section of the chip 1 of the semiconductor integrated circuit device and the bumps 3. The area of the dummy bump 2a is approximately double that of the circuit connection bump 3. There can be obtained a ba capacity effect of an area corresponding to the are occupied by a total of four circuit connection bumps 3. The inside of the are enclose by broken lines corresponds to the area on the chip 1 of he semiconductor integrated circuit device, which is [reserved] for dummy bumps load capacity effect which is identical with that of being achieved by the layout of the related-art bumps as sown in FIG. 2 can be achieved by the bump layout occupying a much smaller area.

Figure 4:
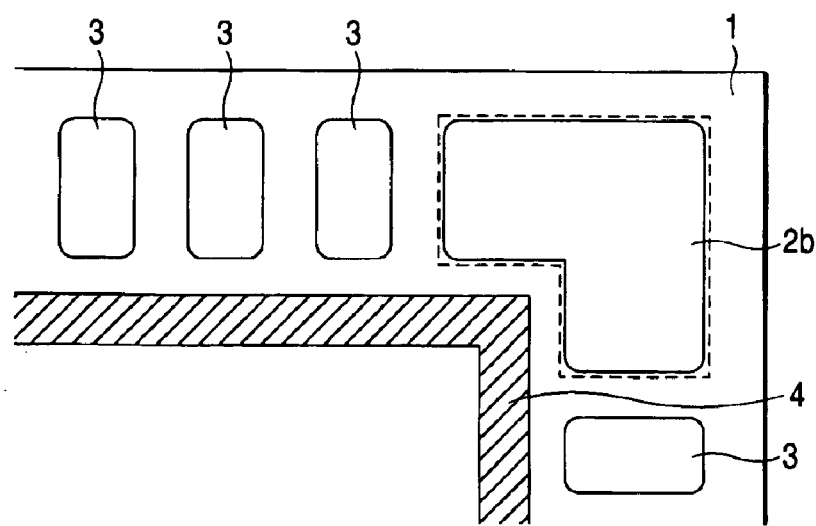
FIG. 4 is a chip view of a semiconductor integrated circuit device having facedown bonding bumps of a second embodiment of the invention provided thereon.

FIG. 4 is a bump layout view showing a second embodiment. There are provided the circuit connection bumps 3 connected to the unillustrated internal circuit, and one dummy bump 2b which is placed at the corner section of the chip 1 of the semiconductor integrated circuit device and assumes a shape, the shape avoiding a circuit wiring 4 and not being rectangular. The area of the dummy bump 2b is four times or more that of the circuit connection bump 3. For this reason, there can be obtained a load capacity effect large than that obtained from the area occupied by the four circuit connection bumps 3. The inside of the area enclosed by broken line corresponds to the area on the chip 1 of the semiconductor integrated circuit device, which is reserved for dummy bumps. A load capacity effect which is identical with that of being achieved by the first embodiment as shown in FIG. 3 is achieved by the bump layout occupying a much smaller area.

Figure 5:
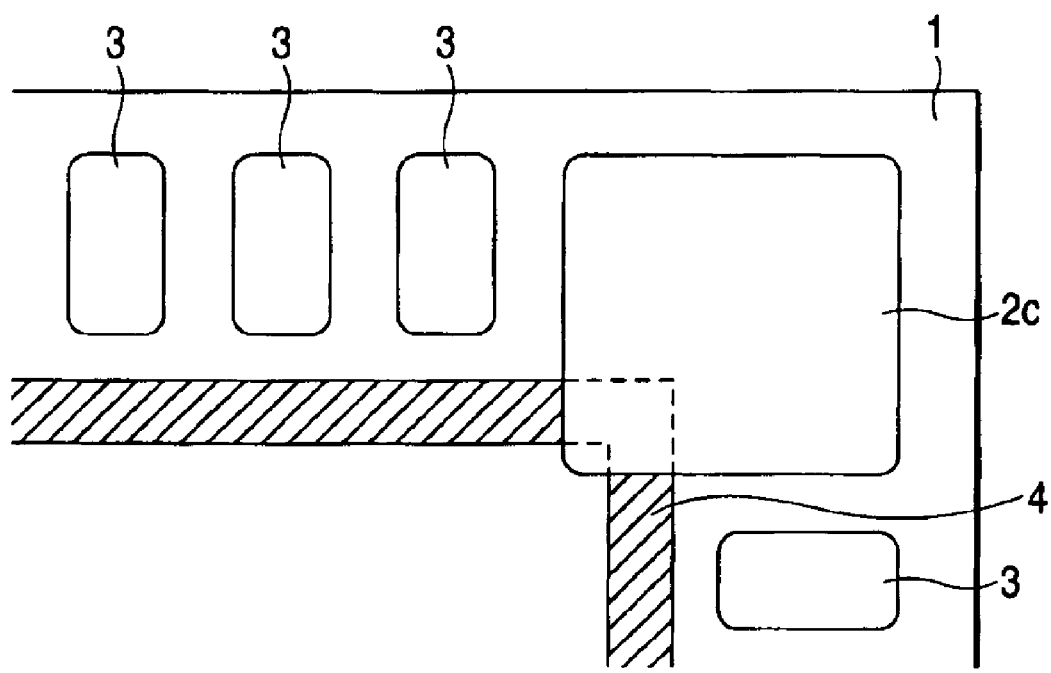
FIG. 5 is a chip view of a semiconductor integrated circuit device having facedown bonding bumps of a third embodiment of the invention provided thereon.
Figure 6:
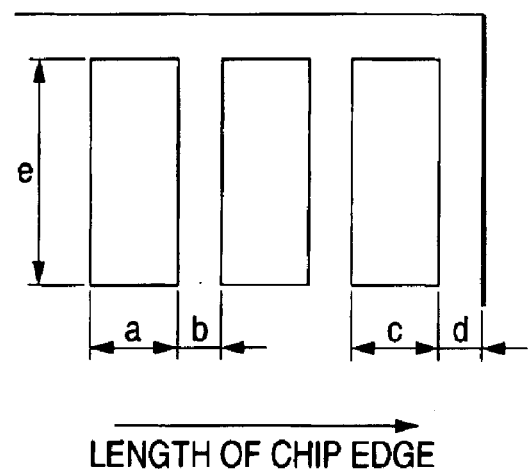
FIGS. 6(a) and 6(b) show the descriptive views for describing a load capacity effect derived from an increase in the area of facedown bonding dummy bumps.
Figure 6:
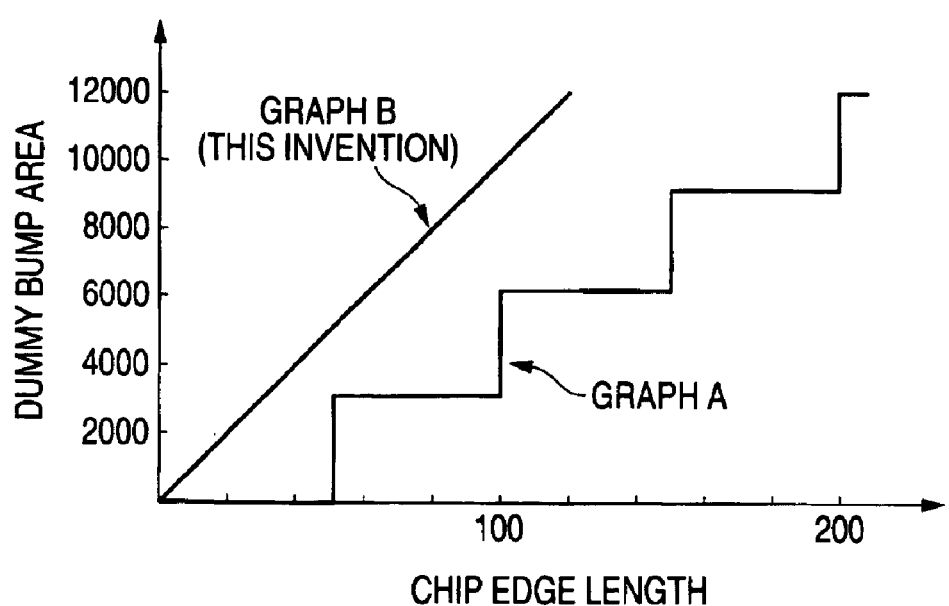
Figure 7:
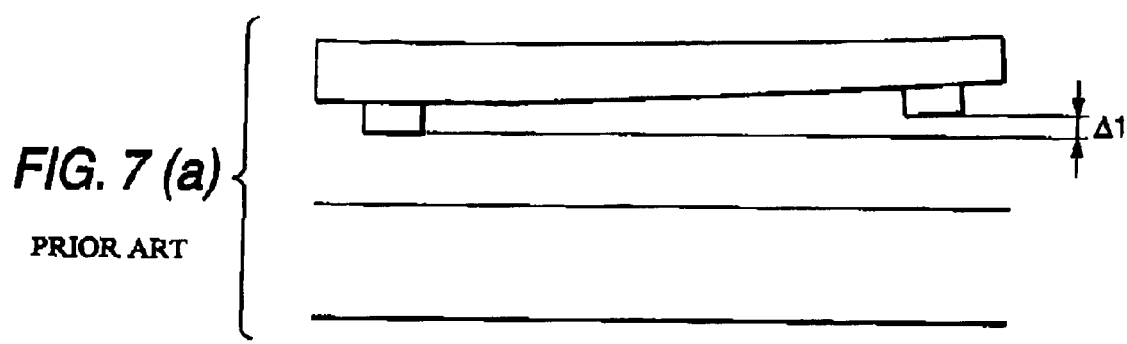
FIGS. 7(a) and 7(b) show the views for describing problems arising at the time of facedown bonding of a chip.
Figure 7:
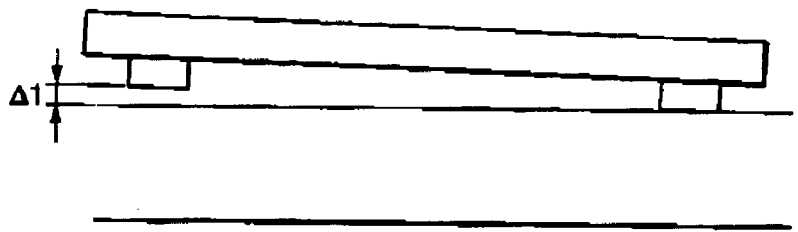
Figure 8:
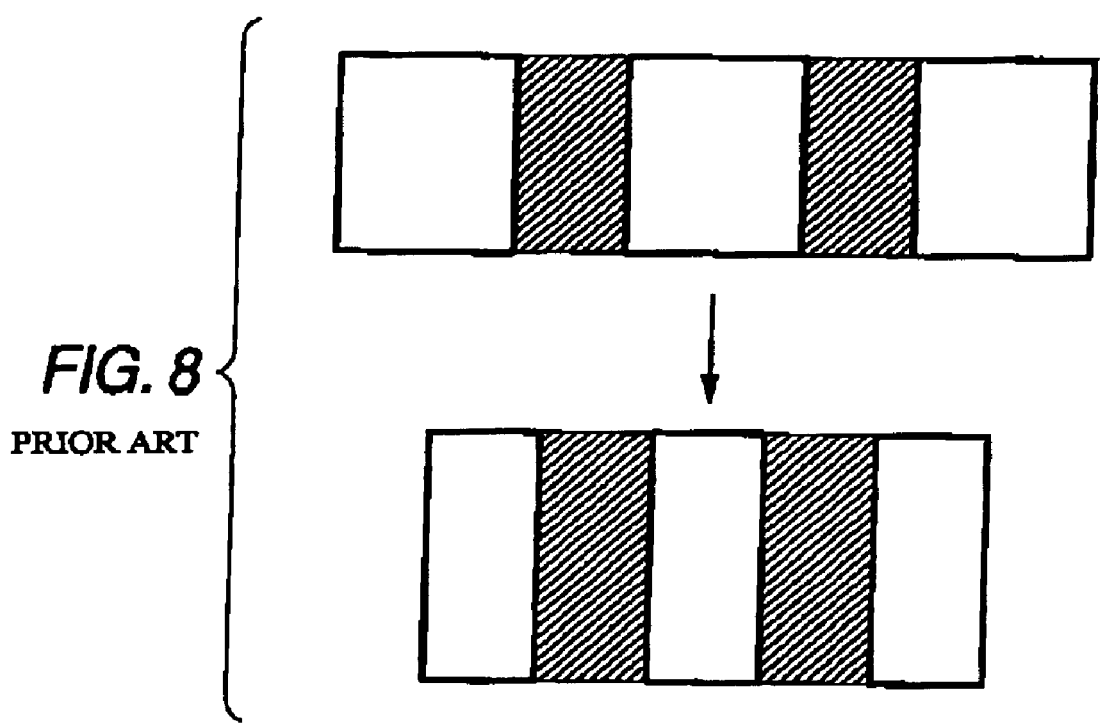
FIG. 8 is a descriptive view showing a change in the shape of a facedown bonding bump.

FIG. 5 is a view showing a third embodiment. There are provided e circuit connection bumps 3 connected to the unillustrated internal circuit, and one rectangular dummy bump 2c which is placed at the corner section of the chip 1 of the semiconductor integrated circuit wiring portion 4. Since there area of the dummy bump 2c is larger than that of the dummy bump 2b of the second embodiment shown in FIG. 4, there can be obtained a load capacity effect which is much greater than that achieved in the second embodiment as shown in FIG. 4.

The load capacity effect achieved when the facedown bonding dummy bumps of the invention are formed on the chip will now be described by references to FIGS. 6(a) and (b). FIG. 6(a) is a front view showing a positional relationship between typical bumps and dummy bumps on a chip, in which a normal bump width is denoted by "a", a bum space by "b", a dummy bump width by "c", and a distance from the dummy bump to the chip edge by "d". For instance, in FIG. 6(a), when these values are assumed such as a=30, b=20, d=20 and e=100, a graph A in FIG. 6(b) shows an example of an increasing area of dummy bumps when the numbers of dummy bumps, each width of the dummy bumps being the same as that of normal bump, are increased stepwisely in the manner of one, two, three, . . . while graph B (this invention) shows the other example when the width of the dummy bump is expanded freely without increasing the number of the dummy bump. As can be seen from the graph, the load capacity effect of the dummy bump can be remarkably improved by increasing thea are of the dummy bumps in linearly or gradually without allowing the chip area to be increased accordingly.

According to a semiconductor integrated circuit device of the invention, dummy bumps having a larger area than that of the circuit connection bumps, which are connected to an internal circuit, can be implemented in an area on a chip of a semiconductor integrated circuit device of which the area to be reserved for dummy bumps is smaller than the related-art dummy bumps. In this way, a load capacity effect which is equal to or greater than that of being imposed on the area of a related-art ship can be made on the chip area that is smaller than that of the related-art chip.

Further, adopting an embodiment in which dummy bumps are provided over some part of the circuit wiring, which is not electrically connected to the dummy bumps with at least one insulating film being interposed in-between, enables a chip area much smaller than a related-art chip area to achieve a load capacity effect which is equal to or greater than that of being achieved by the related-art chip area.

What is claimed is:

1. A semiconductor integrated circuit device comprising a semiconductor substrate and a semiconductor chip having bumps, which are electrically connecting by face down bonding with a terminal section on a surface of the semiconductor substrate, said semiconductor integrated circuit device further comprising:

facedown-bonding dummy bumps which are connected non-electrically and disposed in a vicinity of one or more corner section of four corners of a semiconductor chip, wherein said bumps are arranged along and spaced from a peripheral edge of the semiconductor integrated circuit device and an area of each of said facedown bonding dummy bump projected onto a chip is larger than that of the area of each said facedown bonding bumps, the height of the facedown bonding dummy bumps being the same as the height of the facedowm bonding bumps.

2. The semiconductor integrate circuit device according to claim 1, wherein said dummy bumps act as shock absorbing members for alleviating load stress due to the facedown bonding, and are overlapped with a wiring with at least one insulating film being interposed in-between.

* * * * *